US008957438B2

(12) United States Patent
Cabalu et al.

(10) Patent No.: US 8,957,438 B2
(45) Date of Patent: Feb. 17, 2015

(54) METHODS OF FABRICATING LIGHT EMITTING DEVICES INCLUDING MULTIPLE SEQUENCED LUMINOPHORIC LAYERS

(75) Inventors: Jasper Cabalu, Apex, NC (US); Alan Wellford Dillon, Bahama, NC (US)

(73) Assignee: Cree, Inc., Durham, NC (US)

( * ) Notice: Subject to any disclaimer, the term of this patent is extended or adjusted under 35 U.S.C. 154(b) by 977 days.

(21) Appl. No.: 13/082,034

(22) Filed: Apr. 7, 2011

(65) Prior Publication Data

US 2012/0256211 A1    Oct. 11, 2012

(51) Int. Cl.
*H01L 33/50*  (2010.01)
*H01L 33/62*  (2010.01)

(52) U.S. Cl.
CPC .............. *H01L 33/62* (2013.01); *H01L 33/505* (2013.01); *H01L 33/504* (2013.01); *H01L 2933/0041* (2013.01); *H01L 2933/0066* (2013.01); *H01L 2924/0002* (2013.01)
USPC .......................... 257/98; 438/29; 257/E33.061

(58) Field of Classification Search
USPC ................................ 257/98, E33.061; 438/29
See application file for complete search history.

(56) References Cited

U.S. PATENT DOCUMENTS

| | | | |
|---|---|---|---|
| 4,541,893 A | 9/1985 | Knight | |
| 6,054,389 A | 4/2000 | Cheng | |
| 6,501,091 B1 | 12/2002 | Bawendi et al. | |
| 6,960,878 B2 | 11/2005 | Sakano et al. | |
| 7,342,357 B2 | 3/2008 | Sakano et al. | |
| 7,471,040 B2 * | 12/2008 | Nishimura | 313/501 |
| 7,750,359 B2 | 7/2010 | Narendran et al. | |
| 7,834,953 B2 | 11/2010 | Park et al. | |
| 7,838,896 B2 | 11/2010 | Su et al. | |
| 8,288,936 B2 | 10/2012 | Ohta et al. | |
| 2003/0020084 A1 * | 1/2003 | Fan et al. | 257/92 |
| 2003/0080341 A1 | 5/2003 | Sakano et al. | |
| 2006/0226759 A1 | 10/2006 | Masuda et al. | |
| 2006/0244358 A1 | 11/2006 | Kim et al. | |
| 2007/0024173 A1 | 2/2007 | Braune | |
| 2007/0228949 A1 | 10/2007 | Maruyama et al. | |
| 2008/0099727 A1 | 5/2008 | Sakano et al. | |
| 2008/0173884 A1 | 7/2008 | Chitnis et al. | |
| 2008/0179611 A1 | 7/2008 | Chitnis et al. | |
| 2008/0231170 A1 | 9/2008 | Masato et al. | |
| 2009/0014741 A1 | 1/2009 | Masuda et al. | |
| 2009/0039375 A1 | 2/2009 | LeToquin et al. | |
| 2009/0057690 A1 | 3/2009 | Chakraborty | |

OTHER PUBLICATIONS

International Search Report Corresponding to International Application No. PCT/US2012/030808; Date of Mailing: Jul. 16, 2012; 15 Pages.

(Continued)

*Primary Examiner* — Marc Armand
(74) *Attorney, Agent, or Firm* — Myers Bigel Sibley & Sajovec, P.A.

(57) ABSTRACT

An LED includes a first pedestal and may be fabricated by coating a first phosphor layer on the LED, thinning the first phosphor layer to expose the first pedestal, forming a second pedestal on the first pedestal, coating a second phosphor layer and thinning the second phosphor layer to expose the second pedestal. Alternatively, an LED having a pedestal is coated with a first phosphor layer, coated with a second phosphor layer and then planarized to expose the pedestal. Related structures are also provided.

18 Claims, 2 Drawing Sheets

(56) References Cited

OTHER PUBLICATIONS

International Preliminary Report on Patentability, Application No. PCT/US2012/025534, Aug. 27, 2013.

Collins, "Methods of Forming Warm White Light Emitting Devices Having High Color Rendering Index Values and Related Light Emitting Devices", U.S. Appl. No. 13/017,983, filed Jan. 31, 2011.

* cited by examiner

METHODS OF FABRICATING LIGHT EMITTING DEVICES INCLUDING MULTIPLE SEQUENCED LUMINOPHORIC LAYERS

BACKGROUND OF THE INVENTION

Various embodiments described herein relate to light emitting devices and, more particularly, to solid state light emitting devices that include luminophoric layers thereon.

Light emitting diodes ("LEDs") are well known solid state light emitting sources that are capable of generating light. LEDs generally include a plurality of semiconductor layers that may be epitaxially grown on a semiconductor or non-semiconductor substrate such as, for example, sapphire, silicon, silicon carbide, gallium nitride or gallium arsenide substrates. One or more semiconductor p-n junctions are formed in these epitaxial layers. When a sufficient voltage is applied across the p-n junction, electrons in the n-type semiconductor layers and holes in the p-type semiconductor layers flow toward the p-n junction. As the electrons and holes flow toward each other, some of the electrons will "collide" with a hole and recombine. When this occurs, a photon of light is emitted, to generate light. The wavelength distribution of the light generated by an LED generally depends on the semiconductor materials used and the structure of the thin epitaxial layers that make up the "active region" of the device (i.e., the area where the electrons and holes recombine).

LEDs typically have a narrow wavelength distribution that is tightly centered about a "peak" wavelength (i.e., the single wavelength where the radiometric emission spectrum of the LED reaches its maximum as detected by a photo-detector). For example, the spectral power distributions of a typical LED may have a full width of, for example, about 10-30 nm, where the width is measured at half the maximum illumination (referred to as the full width half maximum or "FWHM" width). Accordingly, LEDs are often identified by their "peak" wavelength or, alternatively, by their "dominant" wavelength. The dominant wavelength of an LED is the wavelength of monochromatic light that has the same apparent color as the light emitted by the LED as perceived by the human eye. Thus, the dominant wavelength differs from the peak wavelength in that the dominant wavelength takes into account the sensitivity of the human eye to different wavelengths of light.

As most LEDs are almost monochromatic light sources that appear to emit light having a single color, LED lamps that include multiple LEDs that emit light of different colors have been used in order to provide solid state light emitting devices that generate white light. In these devices, the different colors of light emitted by the individual LEDs combine to produce a desired intensity and/or color of white light. For example, by simultaneously energizing red, green and blue light emitting LEDs, the resulting combined light may appear white, or nearly white, depending on the relative intensities of the source red, green and blue LEDs.

White light may also be produced by surrounding a single-color LED with a luminophoric material that converts some of the light emitted by the LED to light of other colors. The combination of the light emitted by the single-color LED that passes through the luminophoric material along with the light of different colors that is emitted by the luminophoric material may produce a white or near-white light. For example, a single blue-emitting LED (e.g., made of indium gallium nitride and/or gallium nitride) may be used in combination with a yellow phosphor, polymer or dye such as for example, cerium-doped yttrium aluminum garnet (which has the chemical formula $Y_3Al_5O_{12}$:Ce, and is commonly referred to as YAG:Ce), that "down-converts" the wavelength of some of the blue light emitted by the LED, changing its color to yellow. Blue LEDs made from indium gallium nitride can exhibit high efficiency (e.g., external quantum efficiency as high as 60%). In a blue LED/yellow phosphor lamp, the blue LED chip produces an emission with a dominant wavelength of about 450-460 nanometers, and the phosphor produces yellow fluorescence with a peak wavelength of about 550 nanometers in response to the blue emission. Some of the blue light passes through the phosphor (and/or between the phosphor particles) without being down-converted, while a substantial portion of the light is absorbed by the phosphor, which becomes excited and emits yellow light (i.e., the blue light is down-converted to yellow light). The combination of blue light and yellow light may appear white to an observer. Such light is typically perceived as being cool white in color. In another approach, light from a violet or ultraviolet emitting LED may be converted to white light by surrounding the LED with multicolor phosphors or dyes. In either case, red-emitting phosphor particles (e.g., a CaAlSiN3 ("CASN") based phosphor) may also be added to improve the color rendering properties of the light, i.e., to make the light appear more "warm," particularly when the single color LED emits blue or ultraviolet light.

As noted above, phosphors are one known class of luminophoric materials. A phosphor may refer to any material that absorbs light at one wavelength and re-emits light at a different wavelength in the visible spectrum, regardless of the delay between absorption and re-emission and regardless of the wavelengths involved. Accordingly, the term "phosphor" may be used herein to refer to materials that are sometimes called fluorescent and/or phosphorescent. In general, phosphors may absorb light having first wavelengths and re-emit light having second wavelengths that are different from the first wavelengths. For example, "down-conversion" phosphors may absorb light having shorter wavelengths and re-emit light having longer wavelengths.

LEDs are used in a host of applications including, for example, backlighting for liquid crystal displays, indicator lights, automotive headlights, flashlights, specialty lighting applications and as replacements for conventional incandescent and/or fluorescent lighting in general lighting and illumination applications.

SUMMARY

Light emitting devices are fabricated according to various embodiments described herein by providing a Light Emitting Diode ("LED") including a first conductive pedestal that protrudes away from a face thereof. The LED may be provided in wafer or chip form. A first luminophoric layer is coated on the face, including on the first conductive pedestal. The first luminophoric layer is thinned to expose the first conductive pedestal. A second conductive pedestal is formed on the first conductive pedestal that was exposed. A second luminophoric layer is coated on the first luminophoric layer and on the second conductive pedestal. The second luminophoric layer is thinned to expose the second conductive pedestal.

In some embodiments, the coating of the first luminophoric layer and the coating of the second luminophoric layer are performed using different luminophoric layer coating processes. In other embodiments, the same process, such as syringe or nozzle dispensing, may be used to coat the first and second luminophoric layers.

Moreover, in some embodiments, the first luminophoric layer has a first absorption and emission spectra and the second luminophoric layer has a second absorption and emission spectra wherein a shorter-wavelength end of the emission spectrum of the second luminophoric layer overlaps with a longer-wavelength end of the absorption spectrum of the first luminophoric layer. In some embodiments, the LED has a peak emission wavelength in the blue region, the first luminophoric layer has a first peak emission wavelength in the red region, and the second luminophoric layer has a second peak emission wavelength in the yellow region. Accordingly, sequenced luminophoric layer deposition can be used in devices that use multiple luminophoric materials by arranging the sequence such that the luminophoric layer(s) that can absorb part of the emission of the other luminophoric layer(s) are deposited first in the sequence. This sequenced layer deposition of the various luminophoric layers can increase the color rendering index of the light emitter.

Light emitting devices may be fabricated according to other embodiments described herein by providing an LED including a conductive pedestal that protrudes away from a face thereof and coating a first luminophoric layer on the face including on the conductive pedestal to provide a nonplanar first luminophoric layer. The LED may be provided in wafer or chip form. A second luminophoric layer is coated on the nonplanar first luminophoric layer and on the conductive pedestal. Then, the light emitting device is planarized to expose the conductive pedestal.

In some embodiments, the coating of the first luminophoric layer and the coating of the second luminophoric layer are performed using different luminophoric layer coating processes. For example, the first luminophoric layer may be spray coated, and the second luminophoric layer may be spin coated.

Moreover, in some embodiments, the first luminophoric layer has a first absorption and emission spectra and the second luminophoric layer has a second absorption and emission spectra wherein a shorter-wavelength end of the emission spectrum of the second luminophoric layer overlaps with a longer-wavelength end of the absorption spectrum of the first luminophoric layer. In some embodiments, the LED has a peak emission wavelength in the blue region, the first luminophoric layer has a first peak emission wavelength in the red region, and the second luminophoric layer has a second peak emission wavelength in the yellow region. Accordingly, sequenced luminophoric layer deposition can be used in devices that use multiple luminophoric materials by arranging the sequence such that the luminophoric layer(s) that can absorb part of the emission of the other luminophoric layer(s) are deposited first in the sequence. This sequenced layer deposition of the various luminophoric layers can increase the color rendering index of the light emitter.

Light emitting devices according to various embodiments described herein comprise an LED including a conductive pedestal that extends away from a face thereof. The conductive pedestal includes a first portion adjacent the face, the second portion remote from the face that defines an outer surface, and an interface between the first and second portions. A first luminophoric layer is on the face and extends adjacent the first portion from the face to the interface. A second luminophoric layer is on the first luminophoric layer and extends adjacent the second portion from the interface to the outer surface.

In some embodiments, the conductive pedestal also includes a nonplanar sidewall having a feature that defines the interface. In other embodiments, the interface is a conductive transition region between the first and second portions.

Moreover, in some embodiments, the first luminophoric layer has a first absorption and emission spectra and the second luminophoric layer has a second absorption and emission spectra wherein a shorter-wavelength end of the emission spectrum of the second luminophoric layer overlaps with a longer-wavelength end of the absorption spectrum of the first luminophoric layer. In some embodiments, the LED has a peak emission wavelength in the blue region, the first luminophoric layer has a first peak emission wavelength in the red region, and the second luminophoric layer has a second peak emission wavelength in the yellow region. Accordingly, sequenced luminophoric layer deposition can be used in devices that use multiple luminophoric materials by arranging the sequence such that the luminophoric layer(s) that can absorb part of the emission of the other luminophoric layer(s) are deposited first in the sequence. This sequenced layer deposition of the various luminophoric layers can increase the color rendering index of the light emitter.

In any of the embodiments described herein, the first and/or second luminophoric layers may include one or more luminophoric materials therein. Moreover, more than two luminophoric layers may be provided according to any of the embodiments described herein. Finally, the first and/or second layer need not include luminophoric material therein, but can include any layer that is coated on an LED for various purposes.

DETAILED DESCRIPTION

Figure 1:
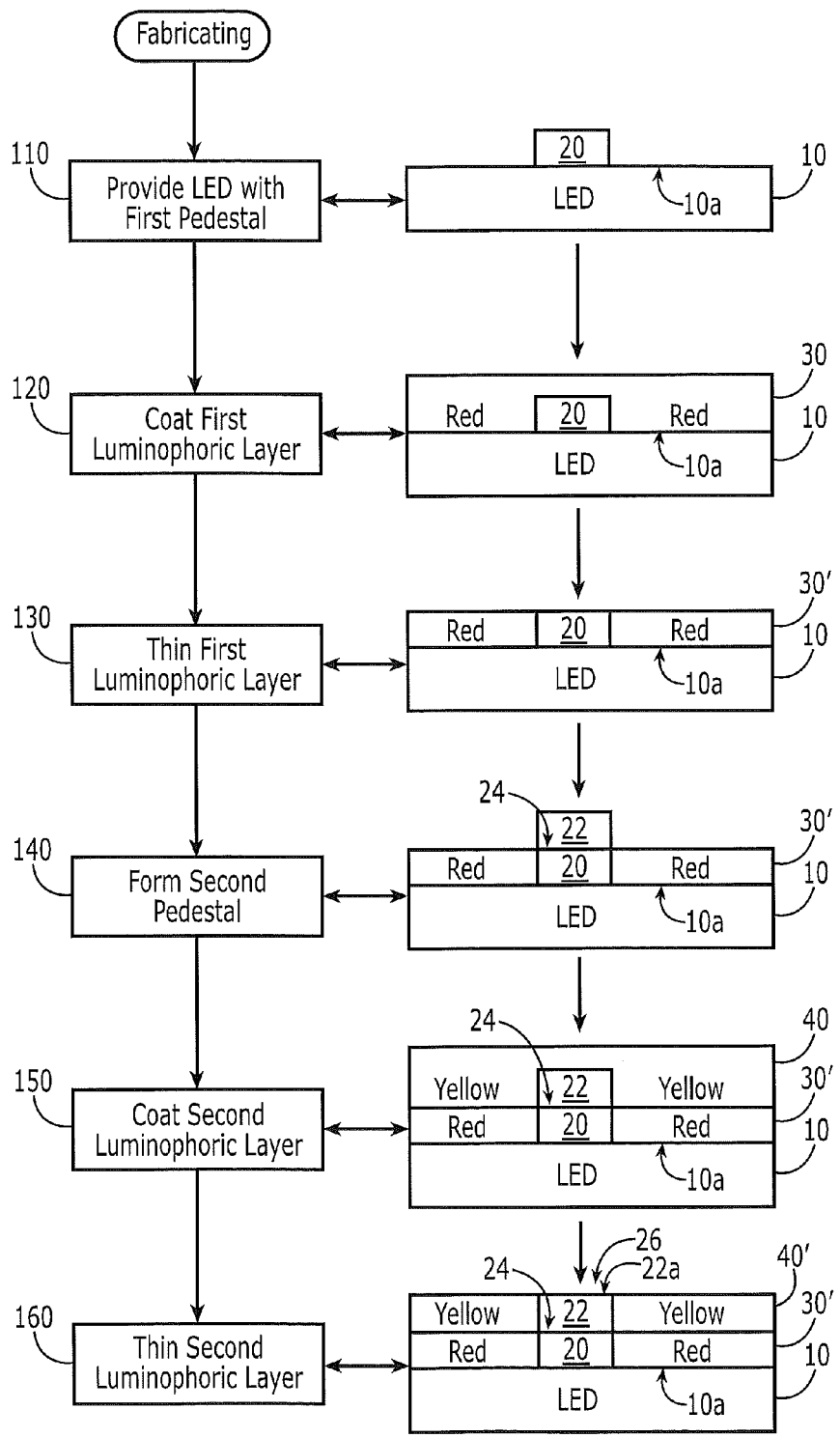
FIG. 1 is a flowchart of methods of fabricating a light emitting device according to various embodiments described herein, and includes cross-sections of light emitting devices that are fabricated according to various embodiments described herein, corresponding to the blocks of the flowchart.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that, when used in this specification, the terms "comprises" and/or "including" and derivatives thereof, specify the presence of stated features, operations, elements, and/or components, but do not preclude the presence or addition of one or more other features, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions and/or layers, these elements, components, regions and/or layers should not be limited by these terms. These terms are only used to distinguish one element, component, region or layer from another element, component, region or layer. Thus, a first element, component, region or layer discussed below could be termed a second element, component, region or layer without departing from the teachings of the present invention.

Embodiments of the invention are described herein with reference to cross-sectional and/or other illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention, unless otherwise defined herein. Moreover, all numerical quantities described herein are approximate and should not be deemed to be exact unless so stated.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower" can, therefore, encompass both an orientation of "lower" and "upper," depending on the particular orientation of the figure.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

As used herein, the term "solid state light emitting device" may include a light emitting diode, laser diode and/or other semiconductor device which includes one or more semiconductor layers, which may include silicon, silicon carbide, gallium nitride and/or other semiconductor materials, an optional substrate which may include sapphire, silicon, silicon carbide and/or other microelectronic substrates, and one or more contact layers which may include metal and/or other conductive materials. The design and fabrication of solid state light emitting devices are well known to those skilled in the art. The expression "light emitting device," as used herein, is not limited, except that it be a device that is capable of emitting light.

Some embodiments described herein can use gallium nitride (GaN)-based LEDs on silicon carbide (SiC)-based substrates. However, it will be understood by those having skill in the art that other embodiments of the present invention may be based on a variety of different combinations of substrate and epitaxial layers. For example, combinations can include AlGaInP LEDs on GaP substrates; InGaAs LEDs on GaAs substrates; AlGaAs LEDs on GaAs substrates; SiC LEDs on SiC or sapphire ($Al_2O_3$) substrates and/or Group III-nitride-based LEDs on gallium nitride, silicon carbide, aluminum nitride, sapphire, zinc oxide and/or other substrates. Moreover, in other embodiments, a substrate may not be present in the finished product. In some embodiments, the LEDs may be gallium nitride-based LED devices manufactured and sold by Cree, Inc. of Durham, N.C., and described generally at cree.com.

Various methods for fabricating LEDs including conductive pedestals and a phosphor coating thereon are described in U.S. Patent Application Publication 2008/0179611 to Chitnis et al., entitled "Wafer Level Phosphor Coating Method and Devices Fabricated Utilizing Method" ("Chitnis et al."), assigned to the assignee of the present application, the disclosure of which is hereby incorporated by reference in its entirety as if set forth fully herein. Moreover, semiconductor light emitting devices including two separated phosphor layers having different peak wavelengths are described in U.S. Patent Application Publication 2009/0039375 to LeToquin et al., entitled "Semiconductor Light Emitting Devices With Separated Wavelength Conversion Materials and Methods of Forming the Same" ("LeToquin et al."), assigned to the assignee of the present application, the disclosure of which is hereby incorporated by reference in its entirety as if set forth fully herein. Various embodiments described herein provide methods of fabricating light emitting devices that include two or more separated luminophoric layers and a conductive pedestal that penetrates through the separated luminophoric layers.

FIG. 1 is a flowchart of methods of fabricating a light emitting device according to various embodiments described herein, and includes cross-sections of light emitting devices that are fabricated according to various embodiments described herein, corresponding to the blocks of the flowchart. Referring now to FIG. 1, at Block 110, an LED 10 is provided including a first conductive pedestal or bump 20 that protrudes away from a face 10a thereof. The LED 10 may be an LED chip or may be provided as part of an LED wafer including the LED 10. Stated differently, operations described herein may be performed on a chip level or a wafer level. The LED 10 and the first conductive pedestal 20 may be fabricated according to any of the techniques that were described in Chitnis et al. and/or other conventional techniques. In some embodiments, the first conductive pedestal may comprise gold that may be formed using stud bumping, and may be between about 15 μm and about 70 μm thick, and, in some embodiments, may be about 4 μm thick.

At Block 120, a first luminophoric layer, such as a red phosphor layer 30, is coated on the face 10*a* including on the first conductive pedestal 20. The first luminophoric layer 30 may comprise red phosphor, such as a CASN-based phosphor, and may be coated using any of the techniques described in Chitnis et al. and/or other conventional techniques. In some embodiments, a syringe or nozzle dispensing process may be employed, for example as described in Chitnis et al. The first luminophoric layer may be between about 10 μm and about 30 μm thick and, in some embodiments, about 14 μm thick.

Then, at Block 130, the first luminophoric layer 30 is thinned to form a thinned first luminophoric layer 30' that exposes the first conductive pedestal 20. Thinning may be performed using mechanical grinding and/or chemical etching, using techniques described, for example, in Chitnis et al. and/or other conventional techniques.

Then, at Block 140, a second conductive pedestal 22 is formed on the first conductive pedestal 20 that was exposed. The second conductive pedestal may also comprise gold and/or other material described in the Chitnis et al. publication, and may be fabricated using techniques described in Chitnis et al. and/or other conventional techniques. The second pedestal may also comprise gold that may be between about 15 μm and about 70 μm thick, and, in some embodiments, about 40 μm thick.

Referring now to Block 150, a second luminophoric layer 40 is coated on the first luminophoric layer 30' that has been thinned and on the second conductive pedestal 22. The second luminophoric layer 40 may comprise yellow phosphor, such as YAG:Ce phosphor, and may be between about 10 μm and about 40 μm thick, and, in some embodiments, about 26 μm thick. The second luminophoric layer 40 may be coated using spin coating and/or any of the other techniques, such as those described in Chitnis et al.

Finally, referring to Block 160, the second luminophoric layer 40 is thinned to form a thinned second luminophoric layer 40' and expose the second conductive pedestal 22. Thinning may take place using any of the techniques described above in connection with Block 130.

The thinning of Blocks 130 and 160 may planarize the structure as illustrated in FIG. 1, or the structure need not be planarized after the thinning. Moreover, more than two luminophoric layers may be provided by repeating the operations of FIG. 1 for any desired number of luminophoric layers.

In some embodiments, coating of the first luminophoric layer 30 at Block 120 and coating of the second luminophoric layer 40 at Block 150 may be performed using the same luminophoric layer coating process, such as syringe or nozzle dispensing. In other embodiments, the first luminophoric layer 30 and the second luminophoric layer 40 may be coated using different processes. For example, spraying may be used to coat the first luminophoric layer 30 at Block 120 and syringe or nozzle dispense may be used to coat the second luminophoric layer 40 at Block 150.

Moreover, in some embodiments, the first luminophoric layer 30 has a first absorption and emission spectra and the second luminophoric layer 40 has a second absorption and emission spectra wherein a shorter-wavelength end of the emission spectrum of the second luminophoric layer overlaps with a longer-wavelength end of the absorption spectrum of the first luminophoric layer. In some embodiments, the LED 10 has a peak emission wavelength in the blue region, the first luminophoric layer has a first peak emission wavelength in the red region, and the second luminophoric layer has a second peak emission wavelength in the yellow region. Accordingly, sequenced luminophoric layer deposition can be used in devices that use multiple luminophoric materials by arranging the sequence such that the luminophoric layer(s) that can absorb part of the emission of the other luminophoric layer(s) are deposited first in the sequence. This sequenced layer deposition of the various luminophoric layers can increase the color rendering index of the light emitter.

Since the first and second conductive pedestals 20 and 22 are formed separately, an interface 24 may be defined therebetween, as illustrated in FIG. 1. The interface may be detected by obtaining an internal cross-section of the first and second conductive pedestals 20 and 22, or by examining an external profile thereof. For example, in some embodiments, the interface may be manifested as a break in the internal crystal structure of the first and second conductive pedestals, the presence of etching or polishing species between the first and second conductive pedestals, and/or other internal structural differences that result from the fabrication of the second conductive pedestal 22 on the first conductive pedestal 20 after thinning of the first luminophoric layer.

Figure 2A:
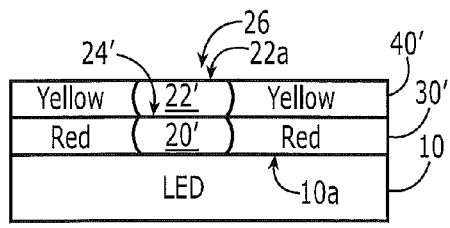
FIGS. 2A and 2B are cross-sections of light emitting devices that are fabricated according to various embodiments described herein.
Figure 2B:
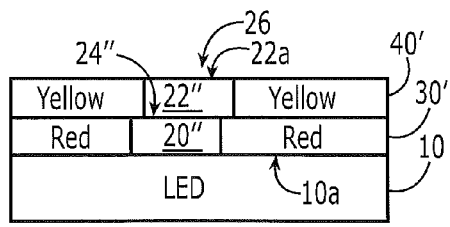

FIGS. 2A and 2B illustrate other embodiments wherein the profile of the sidewall of the first and second conductive pedestals define the interface. For example, FIG. 2A illustrates first and second conductive pedestals 20' and 22' that have slightly bulging sidewalls as a result of bump formation, which define the interface 24' therebetween. FIG. 2B illustrates a second conductive pedestal 22" that is slightly offset from a first conductive pedestal 20" as a result of, for example, alignment tolerances, to define the interface 24". The interface may also be defined by a combination of internal and external structures of the pedestal. Accordingly, in some embodiments, the internal and/or external structure of the pedestal may indicate that the light emitting device was fabricated according to methods of FIG. 1.

The final structures of FIGS. 1, 2A and 2B may also be regarded as providing a light emitting device that comprises an LED 10 including a conductive pedestal 26 that extends from a face 10*a* thereof. The conductive pedestal includes a first portion 20/20'/20" adjacent the face 10*a*, a second portion 22/22'/22" remote from the face 10*a*, and an interface 24/24'/24" between the first and second portions. The second portion 22/22'/22" also includes an outer surface 22*a*. A first luminophoric layer 30' is provided on the face 10*a* and extends adjacent the first portion 20/20'/20" from the face 10*a* to the interface 24/24'/24". A second luminophoric layer 40' is provided on the first luminophoric layer 30' and extends adjacent the second portion 22/22'/22" from the interface 24/24'/24" to the outer surface 22*a*. As also shown in FIGS. 2A and 2B, the conductive pedestal 26 may include a nonplanar sidewall having a feature, such as an indentation (FIG. 2A) or a step (FIG. 2B) that defines the interface. In other embodiments, as shown in FIG. 1, the interface 24 may be a conductive transition region between the first and second portions 20 and 22, respectively.

Figure 3:
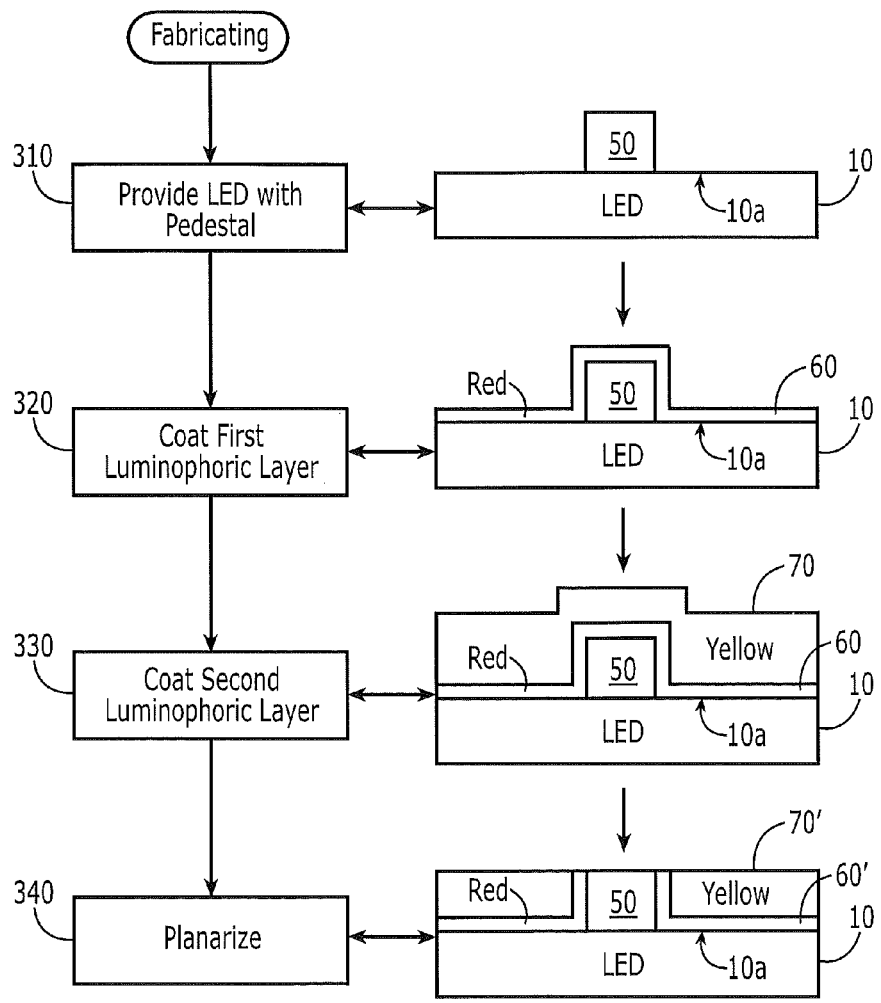
FIG. 3 is a flowchart of other methods of fabricating a light emitting device according to various embodiments described herein, and includes cross-sections of light emitting devices that are fabricated according to various embodiments described herein, corresponding to the blocks of the flowchart.

FIG. 3 is a flowchart of other methods of fabricating a light emitting device according to various embodiments described herein, and includes cross-sections of light emitting devices that are fabricated according to various embodiments described herein, corresponding to the blocks of the flowchart.

Referring to FIG. 3, at Block 310, an LED is provided including a conductive pedestal 50 that protrudes away from a face 10*a* thereof. In some embodiments, the conductive pedestal 50 may be thicker than either of the first or second conductive pedestals 20 or 22 of FIG. 1, because a single conductive pedestal 50 may span two or more luminophoric layers. In some embodiments, the conductive pedestal may be between 30 μm thick and about 70 μm thick, and may be, for example, about 50 μm thick. The conductive pedestal 50 may comprise gold and/or other materials described in Chitnis et al., and may be fabricated as described therein and/or using other conventional techniques.

At Block 320, a first luminophoric layer 60 is coated on the face 10a including on the conductive pedestal 50, to provide a nonplanar first luminophoric layer 60. In some embodiments, the first luminophoric layer may be provided using spray-coating, may be between 10 μm thick and about 30 μm thick, and, more specifically, about 14 μm thick, and may comprise red phosphor, such as CASN phosphor particles.

Referring now to Block 330, a second luminophoric layer 70 is coated on the nonplanar first luminophoric layer 60 and on the conductive pedestal 50. The second luminophoric layer 70 may be nonplanar, as illustrated in FIG. 3 or may be planar. Moreover, the second luminophoric layer 70 may be coated using syringe or nozzle dispensing as described in Chitnis et al. and may comprise YAG:Ce phosphor to provide a dominant wavelength in the yellow region. The second luminophoric layer may be between about 10 μm and about 30 μm thick and, in some embodiments, about 26 μm thick.

Then, as shown at Block 340, the LED is planarized so as to provide a non-planarized first luminophoric layer 60' and a planarized second luminophoric layer 70', and expose the conductive pedestal 50. Planarizing may be performed using polishing and/or etching, as described in Chitnis et al. and/or using other techniques.

Moreover, in some embodiments, the coating of Blocks 320 and 340 may be performed using the same luminophoric layer coating process, or may be performed using different luminophoric layer coating processes, such as spraying the first luminophoric layer 60 and syringe or nozzle dispensing the second luminophoric layer 70. Moreover, coating may be repeated more than two times to provide more than two luminophoric layers.

Embodiments of FIG. 1 and FIG. 3 may also be combined. For example, embodiments of FIG. 3 may be performed, such that the conductive pedestal 50 corresponds to the first conductive pedestal 20 of FIG. 1, except that a plurality of phosphor layers is provided adjacent the first pedestal 50 rather than a single phosphor layer being provided adjacent the pedestal 20 of FIG. 1. Then, operations of FIG. 3 may be performed again to form a second conductive pedestal corresponding to pedestal 22 of FIG. 1 on the pedestal 50 of FIG. 3. Stated differently, operations of FIG. 3 may be performed in sequence two or more times as was described in connection with FIG. 1.

Various embodiments described herein can allow light emitting devices to be fabricated with multiple luminophoric layers and a pedestal that penetrates through the multiple luminophoric layers. One or more of the luminophoric layers may extend on the side surfaces of the LED 10 in any of these embodiments. Moreover, although the LED 10 has been described as a blue LED, other types of LEDs including ultraviolet LEDs may be used, with appropriate luminophoric layers. In general, any combination of LEDs and luminophoric layers may be used with various embodiments described herein.

Various embodiments described herein can achieve high Color Rendering Index (CRI) of white LEDs that use two or more luminophoric mediums, such as phosphor, by placing the luminophoric mediums in a specific sequence on the LED to reduce, and in some embodiments to minimize, reabsorption of the emitted photons from one of the luminophoric medium(s) by the other luminophoric medium(s). As is well known, the CRI of a light source is a modified average of the relative measurements of how the color rendition of an illumination system compares to that of a reference black body radiator when illuminating eight reference colors, and can provide an indication of the ability of a light source to accurately reproduce color in illuminating objects. Moreover, various embodiments described herein can provide processes that can be repeatedly used in high volume manufacturing to obtain LEDs that use two or more luminophoric mediums in sequence. The thicknesses and/or other characteristics of the luminophoric layers can be well controlled.

Various embodiments have been described herein in connection with first and second luminophoric layers. It will be understood that each of these luminophoric layers may include one or more phosphors therein. Thus, in any given layer, two or more separate phosphors may be mixed together and/or grown together in the same structure. In one specific example, the first luminophoric layer may include yellow and red phosphor, and the second luminophoric layer may include green phosphor. Various examples of luminophoric layers that include multiple phosphors are described in application Ser. No. 13/017,983 to Collins et al., filed Jan. 11, 2011, entitled Methods of Forming Warm White Light Emitting Devices Having High Color Rendering Index Values and Related Light Emitting Devices, assigned to the assignee of the present application, the disclosure of which is hereby incorporated by reference in its entirety as if set forth fully herein.

Moreover, various embodiments have been described herein in terms of luminophoric layers. However, any of these embodiments may also be used to deposit layers that are not luminophoric layers on an LED that includes a conductive pedestal that protrudes away from a face thereof. Accordingly, the first and/or second layers need not include luminophoric material therein, and may include other materials, such as light scattering materials therein. In one specific example, the first layer may not be a luminophoric layer and the second layer may include a mixture of yellow, red and/or green luminophoric materials.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of fabricating a light emitting device, comprising:
providing a Light Emitting Diode ("LED") including a first conductive pedestal that protrudes away from a face thereof;
coating a first luminophoric layer on the face including on the first conductive pedestal;
thinning the first luminophoric layer to expose the first conductive pedestal;
forming a second conductive pedestal on the first conductive pedestal that was exposed;

coating a second luminophoric layer on the first luminophoric layer and on the second conductive pedestal; and thinning the second luminophoric layer to expose the second conductive pedestal.

2. A method according to claim 1 wherein coating the first luminophoric layer and coating the second luminophoric layer are performed using different luminophoric layer coating processes.

3. A method according to claim 1 wherein coating the first luminophoric layer and coating the second luminophoric layer both comprise syringe or nozzle dispensing.

4. A method according to claim 1:

wherein the first luminophoric layer has a first absorption and emission spectra and the second luminophoric layer has a second absorption and emission spectra, and wherein a shorter wavelength end of the emission spectrum of the second luminophoric layer overlaps with a longer wavelength end of the absorption spectrum of the first luminophoric layer.

5. A method according to claim 1 wherein providing an LED comprises providing a wafer including the LED.

6. A method according to claim 1 wherein providing an LED comprises providing an LED chip.

7. A method according to claim 4 wherein the LED has a peak emission wavelength in the blue region, the first luminophoric layer has a peak emission wavelength in the red region and the second luminophoric layer has a peak emission wavelength in the yellow region.

8. A method of fabricating a light emitting device, comprising:

providing a Light Emitting Diode ("LED") including a conductive pedestal that protrudes away from a face thereof;

coating a first luminophoric layer on the face including on the conductive pedestal to provide a nonplanar first luminophoric layer;

coating a second luminophoric layer on the nonplanar first luminophoric layer and on the conductive pedestal; and then planarizing the LED to expose the conductive pedestal.

9. A method according to claim 8 wherein coating the first luminophoric layer and coating the second luminophoric layer are performed using different luminophoric layer coating processes.

10. A method according to claim 8 wherein coating the first luminophoric layer comprises spray coating the first luminophoric layer and wherein coating the second luminophoric layer comprises syringe or nozzle dispensing the second luminophoric layer.

11. A method according to claim 8:

wherein the first luminophoric layer has a first absorption and emission spectra and the second luminophoric layer has a second absorption and emission spectra, and wherein a shorter wavelength end of the emission spectrum of the second luminophoric layer overlaps with a longer wavelength end of the absorption spectrum of the first luminophoric layer.

12. A method according to claim 8 wherein providing an LED comprises providing a wafer including the LED.

13. A method according to claim 8 wherein providing an LED comprises providing an LED chip.

14. A method according to claim 11 wherein the LED has a peak emission wavelength in the blue region, the first luminophoric layer has a peak emission wavelength in the red region and the second luminophoric layer has a peak emission wavelength in the yellow region.

15. A method of fabricating a light emitting device, comprising:

providing a Light Emitting Diode ("LED") including a first conductive pedestal that protrudes away from a face thereof;

coating a first layer on the face including on the first conductive pedestal;

thinning the first layer to expose the first conductive pedestal;

forming a second conductive pedestal on the first conductive pedestal that was exposed;

coating a second layer on the first layer and on the second conductive pedestal; and thinning the second layer to expose the second conductive pedestal.

16. A method according to claim 15 wherein coating the first layer and coating the second layer are performed using different coating processes.

17. A method of fabricating a light emitting device, comprising:

providing a Light Emitting Diode ("LED") including a conductive pedestal that protrudes away from a face thereof;

coating a first layer on the face including on the conductive pedestal to provide a nonplanar first layer;

coating a second layer on the nonplanar first layer and on the conductive pedestal; and then planarizing the LED to expose the conductive pedestal.

18. A method according to claim 17 wherein coating the first layer and coating the second layer are performed using different coating processes.

* * * * *

UNITED STATES PATENT AND TRADEMARK OFFICE
CERTIFICATE OF CORRECTION

| | | |
|---|---|---|
| PATENT NO. | : 8,957,438 B2 | Page 1 of 1 |
| APPLICATION NO. | : 13/082034 | |
| DATED | : February 17, 2015 | |
| INVENTOR(S) | : Cabalu et al. | |

It is certified that error appears in the above-identified patent and that said Letters Patent is hereby corrected as shown below:

In the Specification
Column 7, Line 2: Please correct "about 4 μm thick."
                       to read -- about 40μm thick. --

Signed and Sealed this
Twenty-first Day of July, 2015

Michelle K. Lee
*Director of the United States Patent and Trademark Office*